(12) United States Patent
Nakaharai et al.

(10) Patent No.: US 7,557,018 B2
(45) Date of Patent: Jul. 7, 2009

(54) ELEMENT FABRICATION SUBSTRATE

(75) Inventors: Shu Nakaharai, Kawasaki (JP);
Tsutomu Tezuka, Yokohama (JP);
Shinichi Takagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 11/510,745

(22) Filed: Aug. 28, 2006

(65) Prior Publication Data

US 2006/0292835 A1    Dec. 28, 2006

Related U.S. Application Data

(62) Division of application No. 10/979,885, filed on Nov. 3, 2004, now abandoned.

(30) Foreign Application Priority Data

Nov. 4, 2003    (JP)    ............................. 2003-374571

(51) Int. Cl.
*H01L 21/20*    (2006.01)
*H01L 21/84*    (2006.01)
(52) U.S. Cl. ..................... 438/479; 117/9; 117/939; 438/767
(58) Field of Classification Search .............. 438/479, 438/767; 117/7, 9, 939
See application file for complete search history.

(56) References Cited

U.S. PATENT DOCUMENTS

| 4,975,387 | A * | 12/1990 | Prokes et al. ................. 438/486 |
| 6,369,438 | B1 | 4/2002 | Sugiyama et al. |
| 6,509,587 | B2 | 1/2003 | Sugiyama et al. |
| 6,607,948 | B1 | 8/2003 | Sugiyama et al. |
| 6,713,779 | B2 | 3/2004 | Tezuka et al. |
| 6,727,550 | B2 | 4/2004 | Tezuka et al. |
| 7,084,460 | B2 * | 8/2006 | Chen et al. ................... 257/347 |
| 7,332,417 | B2 * | 2/2008 | Westhoff et al. ............ 438/509 |
| 2005/0003229 | A1 * | 1/2005 | Bedell et al. ................. 428/641 |
| 2005/0215071 | A1 * | 9/2005 | Moriceau et al. ............ 438/770 |
| 2006/0281234 | A1 * | 12/2006 | Sugiyama et al. ........... 438/151 |
| 2007/0111474 | A1 * | 5/2007 | Delattre et al. .............. 438/459 |
| 2007/0207598 | A1 * | 9/2007 | Damlencourt et al. ....... 438/479 |
| 2008/0135830 | A1 * | 6/2008 | Westhoff et al. .............. 257/19 |

FOREIGN PATENT DOCUMENTS

JP    2002-076347    3/2002

(Continued)

OTHER PUBLICATIONS

Tezuka, et al.; "Fabrication of strained Si on an ultrathin SiGe-on-insulator virtual substrate with a high-Ge fraction"; Applied Physics Letters; Sep. 17, 2001; pp. 1798-1800.

(Continued)

*Primary Examiner*—M. Wilczewski
(74) *Attorney, Agent, or Firm*—Finnegan, Henderson, Farabow, Garrett & Dunner, L.L.P.

(57) ABSTRACT

A substrate used for fabricating devices thereon includes an insulating film, and a monocrystal Ge thin layer formed on the insulating film in contact therewith, the monocrystal Ge thin layer having a thickness not more than 6 nm. The monocrystal Ge thin layer has a thickness not less than 2 nm and a compressive strain.

4 Claims, 2 Drawing Sheets

FOREIGN PATENT DOCUMENTS

JP 2006-351612 * 12/2006

OTHER PUBLICATIONS

Nakaharai, et al.; "Fabrication of Ultra-Thin Strained Ge-on-Insulator Substrate by Ge-Condensation Technique"; Extended Abstracts of the 2003 International Conference on Solid State Devices and Materials; 2003; pp. 266-267; Tokyo.

Nakaharai, et al.; "Characterization of 7-nm-thick strained Ge-on-insulator layer fabricated by Ge-condensation technique"; Applied Physics Letters; Oct. 27, 2003, pp. 3516-3518.

Tezuka, et al.; "Ultrathin Body SiGe-on-Insulator pMOSFETs With High-Mobility SiGe Surface Channels"; IEEE Transactions on Electron Devices, vol. 50, No. 5, May 2003; pp. 1328-1333.

Tezuka, et al.; "Field Effect Transistor"; Jul. 1, 2003; U.S. Appl. No. 10/609,650.

Tezuka, et al.; "Semiconductor Device Manufacturing Method"; Jul. 29, 2003; U.S. Appl. No. 10/628,513.

Sugiyama; "Semiconductor Device and Method for Manufacturing Substrate"; Jul. 2, 2003; U.S. Appl. No. 10/611,157.

Decision of Rejection from the Japanese Patent Office, mailed Oct. 17, 2006, in Japanese Patent Application No. 2003-374571, and English Translation thereof.

* cited by examiner

ELEMENT FABRICATION SUBSTRATE

CROSS-REFERENCE TO RELATED APPLICATIONS

This application is a division of application Ser. No. 10/979,885, filed on Nov. 3, 2004 now abandoned, which is based upon and claims the benefit of priority from prior Japanese Patent Application No. 2003-374571, filed on Nov. 4, 2003. The entire contents of these related applications are incorporated herein by reference.

BACKGROUND OF THE INVENTION

The present invention relates to a substrate for device fabrication, the substrate having a monocrystal Ge thin layer for forming field effect transistors of high-performance thereon, a semiconductor device using this substrate, and a method for manufacturing the substrate.

Conventionally, a method for increasing a drive current per a unit gate length by shortening a gate length of an individual transistor and thinning a gate insulation layer is adopted for realizing high-performance/high function of CMOS circuit device. By this method, the size of a transistor to provide a necessary drive current is decreased. This makes it possible to realize a high integration, and to lower a drive voltage, resulting in decreasing a power consumption per a unit element.

However, improvement of performance required in late years increases a technical barrier to be solved for the purpose of decreasing a gate length. It is effective to use channel materials of high mobility in order to relax the circumstances. Ge is an influential candidate for the channel materials. Ge has higher mobility than Si with respect to electrons and holes. It is known that hole mobility largely increases by giving a compressive strain to Ge. In a bulk semi-conductor, hole mobility is low in comparison with electron mobility. Therefore, increase of hole mobility contributes to higher performance of a circuitry.

There is a problem that a parasitic capacitance of source and drain junctions disturbs a transistor operation which is caused by micronization of a transistor. A fully-depleted type device structure wherein a buried insulator layer is formed under a semi-conductor thin channel layer is considered in order to avoid this problem. The film thickness of the semiconductor thin channel layer in this case is not more than about 6 nm with respect to a transistor of a gate length 25 nm, for example. If a channel is formed by a strained Ge thin film on a buried insulating layer combining the feature of a strained Ge channel and that of a fully-depleted type device structure, it is possible to fabricate a high performance transistor. However, an on-insulating film laminating strain Ge thin layer having these both features is not realized under the present circumstances.

In a document "T. Tezuka, N. Sugiyama, S. Takahi, Appl. Phys. Lett. 79, p1798 (2001)", the inventors of the present invention proposes the Ge-condensation by oxidation method to make Ge composition in SiGe increase by oxidizing a monocrystal Si layer formed on an insulating film on a supporting substrate and a monocrystal SiGe layer containing Ge composition of about 10% which is formed on the Si layer. However, this method is a method for manufacturing a lattice-relaxed SiGe layer of high Ge composition as a substrate for a strained Si layer, unlike a method for forming a strained Ge thin layer. Further, this method does not consider thinning the film thickness of the Ge layer.

The substrate having a strained Ge thin layer on an insulating film is expected as a substrate used for making a field effect transistor with high mobility. However, a technique to form a strained Ge thin layer of extremely thin film thickness on an insulating film has not yet been realized.

The present invention is to provide a substrate for device fabrication having an extremely thin Ge layer on an insulating film.

BRIEF SUMMARY OF THE INVENTION

According to an aspect of the present invention, there is provided a substrate for device fabrication comprising: an insulating film; and a monocrystal Ge thin layer formed on the insulating film in contact therewith, the layer having a thickness not more than 6 nm.

DETAILED DESCRIPTION OF THE INVENTION

An embodiment of the present invention will be described referring to drawings.

FIGS. 1A to 1D illustrate sectional structures in steps of manufacturing a substrate used for fabricating devices such as transistors thereon, according to an embodiment of the present invention.

Figure 1A:
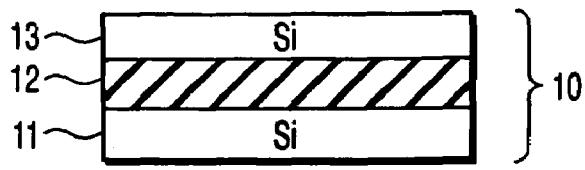
FIGS. 1A to 1D show sectional views of substrate structures in steps of substrate manufacturing according to an embodiment of the present invention.

As shown in FIG. 1A, a SOI substrate 10 is prepared by forming an insulating film 12 of, for example, $SiO_2$ on a Si substrate 11 and then forming a Si thin layer 13 on the insulating film.

Figure 1B:
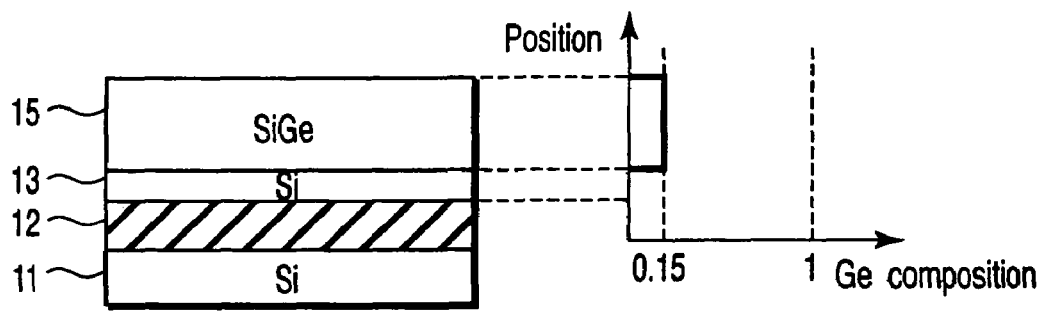

As shown in FIG. 1B, $Si_{1-x}Ge_x$ crystal is grown to a thickness of $d_i$ (nm) with Ge composition $x_i$ on the Si thin film 13 on the insulating film Si by, for example, the CVD method to form a SiGe layer 15. In the present embodiment, assuming $d_i$=40 nm, and $x_i$=0.15.

Figure 1C:
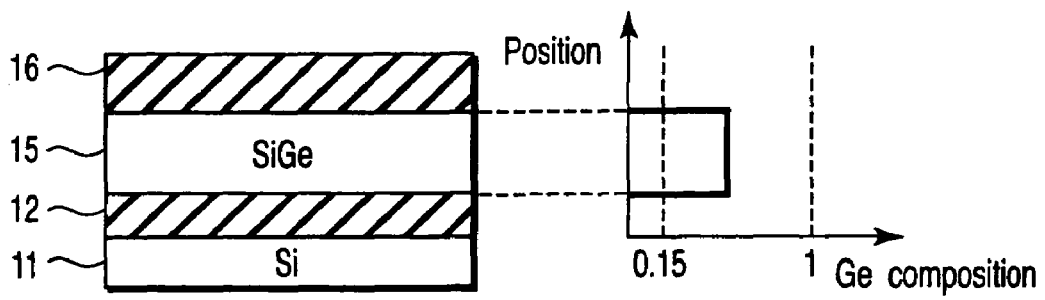

As shown in FIG. 1C, the substrate is subjected to thermal oxidation in oxidation ambient atmosphere. In the step of FIG. 1C, a Si oxidation film 16 is formed by oxidizing only Si in the Si thin layer 13 and SiGe layer 15. In this time, Ge is rejected from the oxide film 16 and accumulated in the SiGe layer 15, resulting in that Ge composition in the SiGe layer 15 increases. When the Ge composition in the SiGe layer 15 is not less than 60%, the oxidation temperature or heating temperature exceeding 1000° C. is desirable. This provides an effect that the Ge composition in the SiGe layer 15 is uniformized and generation of defects is suppressed, and an effect to shorten an oxidation time. The temperature must be decreased with increase of Ge composition. Finally, the oxidation temperature has to be not more than the melting temperature of Ge of 937° C.

Figure 2:
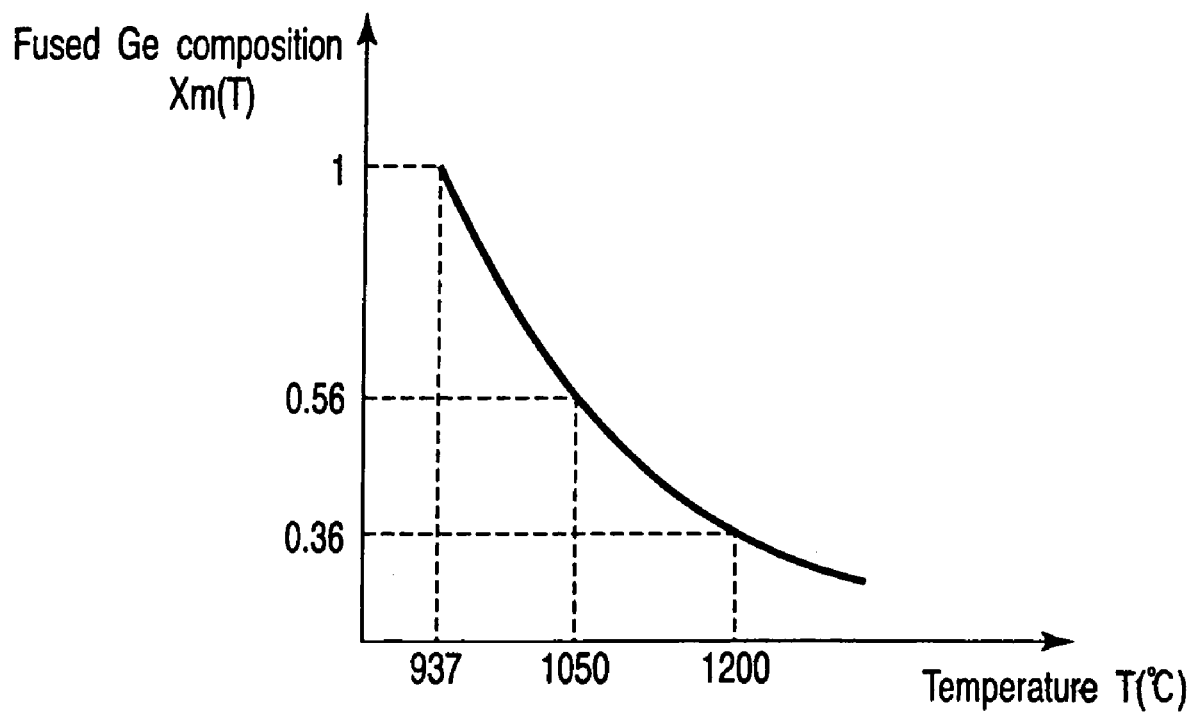
FIG. 2 shows a temperature dependence of melting Ge composition $x_m(T)$ of $Si_{1-x}Ge_x$.

FIG. 2 shows a relation between the Ge composition of SiGe layer and the melting temperature. It is understood from FIG. 2 that the melting temperature decreases as Ge composition increases according to progress of oxidation. The SiGe layer 15 should not be melted in order to remain a strain in the Ge thin layer that is finally obtained. Accordingly, it is understood that a temperature less than the melting temperature of SiGe but sufficiently high temperature is needed for oxidation of the SiGe layer, and the final heating temperature must be not more than 937° C.

According to the experiment of the present inventors, the final oxidation temperature must be not more than 900° C. for formation of a Ge thin layer whose thickness is 15 nm. The final oxidation temperature of 930° C. precludes formation of a high quality GOI layer having a strain. In other words, at a final oxidation temperature near the melting temperature of Ge, for example, 930° C., degradation of crystalline quality is recognized. However, a high quality single crystal was obtained at a final oxidation temperature not more than 900° C. In the case that a final film thickness of Ge layer less than 3 nm, the final oxidation temperature must be further decreased. Concretely, setting the final oxidation temperature of 850° C. for a GOI layer of a thickness less than 3 nm provides a good quality crystal.

A conventional Ge condensation by oxidation method needs to set a substrate heating temperature at a high temperature exceeding 1000° C. for the purpose of relaxing the lattice strain of the SiGe layer and uniformize a Ge composition profile. However, although the substrate heating temperature is set at a temperature exceeding 1000° C. in an initial stage, it is important to remain as much strain as possible in the SiGe layer in the final stage (Ge composition more than 80%). Therefore, in the present embodiment, the substrate heating temperature exceeding 1000° C. in the initial stage is decreased gradually to 900° C. in the final stage. The composition profile is able to be uniformized sufficiently even a low temperature not more than 900° C. a diffusion coefficient of Si in the Ge single crystal is sufficiently large).

Figure 1D:
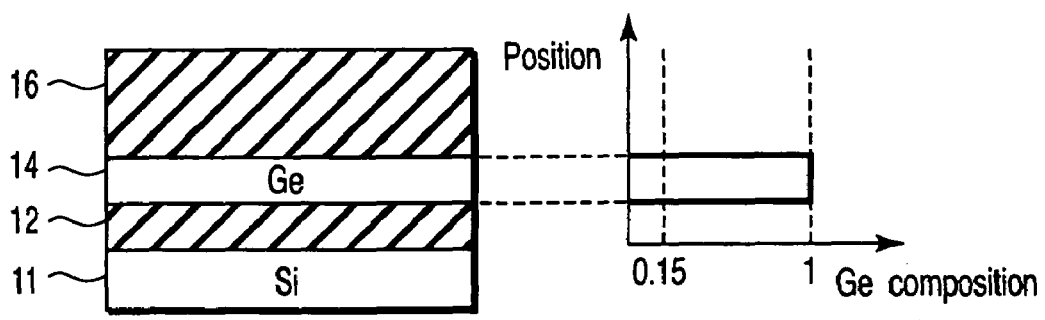

In this way, in the present embodiment, for fabrication of Ge layer by the Ge condensation by oxidation method, the oxidation temperature is set at a temperature exceeding 1000° C. at first, and the oxidation is done at the temperature of 900° C. at last. As a result, Ge in the SiGe layer 15 is condensed, and a pure monocrystal Ge thin layer 14 (film thickness df) is finally formed on the insulating film as shown in FIG. 1D. In this way, the monocrystal SiGe layer 15 are transformed to the monocrystal Ge thin layer 14.

In the present embodiment, a monocrystal strained Ge thin film having a strain of 1.1% and $d_f$=6 nm is formed on an insulating film. This substrate for device fabrication has a structure that a strained Ge thin film is directly in contact with a buried insulating film.

If the Ge thin layer finally formed is too thin, it is impossible to give a compression strain. According to an experiment of the inventors of the present invention, the following became clear. That is, it is impossible to give a compression strain if the Ge thin layer is thinner than 2 nm. If it is not less than 2 nm, it is possible to give a compression strain. If it is not less than 4 nm, it is possible to give a sufficient compression strain. Accordingly, the lower limit of the thickness of the Ge thin layer is 2 nm, preferably not less than 4 nm.

In a conventional method, a perfect monocrystal Ge layer on an insulating film is formed by directly transferring a thin Ge layer on another substrate. In this case, it is difficult to make the thickness of the Ge layer not more than 10 nm. However, in the present embodiment, it is possible to make the thickness of the Ge layer not more than 6 nm, e.g. about 2 nm.

Figure 3:
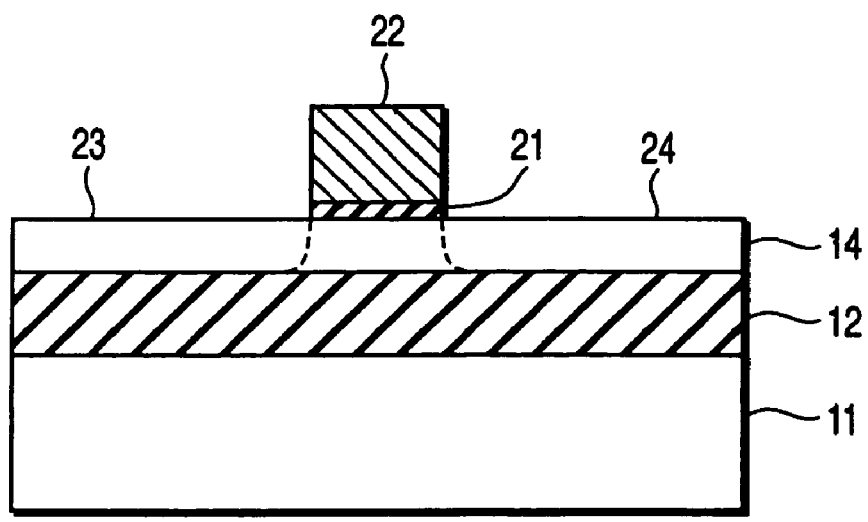
FIG. 3 is a sectional view of an device structure of a MOSFET using the device fabrication substrate of FIG. 1.

Using a substrate for device fabrication as shown in FIG. 1D, a gate electrode 22 is formed via a gate insulating film 21 as shown in FIG. 3. Further, a source region 23 and a drain region 24 are formed. As a result, a high-performance MOSFET is fabricated because of high mobility of a strained Ge channel. It is possible to realize a fully-depleted type device structure having a strained Ge channel by setting the film thickness of the strained Ge thin film 14 at not more than 6 nm with a gate length of 25 nm, and therefore a MOSFET of higher performance is fabricated.

The hole mobility largely increases by giving the Ge thin layer 14 a compressive strain, and a difference between the hole mobility and the electron mobility can be reduced. This is effective when a CMOS structure is fabricated.

The present invention is not limited to the embodiment. The thickness of the monocrystal Ge thin layer is not limited to the embodiment, and may be not more than 6 nm to get performance enhancement intended by the present invention with respect to a device of a short gate length. Further, various conditions to make the thickness of the Ge thin film not less than 2 nm may be set for the Ge layer to have a sufficient strain. In addition, it is most desirable that the monocrystal Ge thin layer has a strain in the light of mobility. However, even if it has no strain, it provides an enhancement effect on mobility in comparison with Si. In this case, a range of the heating temperature of the SiGe layer, the thickness of the final Ge thin layer and so on becomes wider than in a case for forming a strained Ge thin layer.

In addition, the Ge composition in the SiGe layer before heat treatment is set to 15%. However, if the Ge density is too high, high quality single crystal is not provided. Accordingly, it is desirable that Ge composition at the time of the SiGe formation is not less than 60%. Further, a SiGe layer formation method is not limited to a CVD method, and should use a method for forming a thin SiGe layer on a Si layer in uniform and high quality.

According to the present invention, by improving an Ge condensation by oxidation method for increasing Ge composition by oxidation, a high quality monocrystal Ge thin film can be formed on an insulating film by oxidizing sufficiently a SiGe layer containing a comparatively large amount of Ge composition at a temperature less than a melting temperature of SiGe.

In particular, it is possible to make a Ge thin layer having a compressive strain by making the film thickness of the final Ge thin layer not less than about 2 nm. Fabricating MOSFET by using such a Ge thin layer allows realizing a high-performance CMOS structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a substrate on which a semiconductor device is fabricated, the method comprising:
    forming a monocrystal SiGe layer on a monocrystal Si layer formed on an insulating film; and
    thermal-oxidizing the monocrystal Si layer and the SiGe layer at an initial oxidation temperature at a first stage and at a final oxidation temperature lower than the initial oxidation temperature at a final stage to form a Si oxide film on the Si layer and the SiGe layer on a side opposite to the insulating film and to form a monocrystal Ge layer having a compressive strain, wherein the thermal-oxidizing is performed at a temperature not more than a melting temperature of the SiGe layer, and by setting the initial oxidation temperature at a value exceeding 1000°

C. and a final oxidation temperature at not more than 900° C. while decreasing the heating temperature gradually.

2. The method according to claim 1, wherein the thermal-oxidizing is performed to form the monocrystal Ge layer of not less than 4 nm.

3. A method of manufacturing a substrate on which a semiconductor device is fabricated, the method comprising:
forming a monocrystal SiGe layer on a monocrystal Si layer formed on an insulating film; and
thermal-oxidizing the monocrystal Si layer and the SiGe layer at an initial oxidation temperature at a first stage and at a final oxidation temperature lower than the initial oxidation temperature at a final stage to form a Si oxide film on the Si layer and the SiGe layer on a side opposite to the insulating film and to form a monocrystal Ge layer having a compressive strain, wherein the thermal-oxidizing is performed at a temperature not more than a melting temperature of the SiGe layer, and by setting the initial oxidation temperature at a value exceeding 1000° C. and a final oxidation temperature at not more than 850° C. for the Ge layer being less than 3 nm thick while decreasing the heating temperature gradually.

4. The method according to claim 3, wherein the thermal-oxidizing is performed to form the monocrystal Ge layer of not less than 2 nm.

* * * * *